US007186314B2

(12) United States Patent
Ishii et al.

(10) Patent No.: US 7,186,314 B2
(45) Date of Patent: Mar. 6, 2007

(54) PLASMA PROCESSOR AND PLASMA PROCESSING METHOD

(75) Inventors: Nobuo Ishii, Hyogo (JP); Kibatsu Shinohara, Kanagawa (JP)

(73) Assignees: Tokyo Electron Limited, Tokyo (JP); Nihon Koshuha Co., Ltd., Kanagawa (JP)

( * ) Notice: Subject to any disclaimer, the term of this patent is extended or adjusted under 35 U.S.C. 154(b) by 35 days.

(21) Appl. No.: 10/543,857

(22) PCT Filed: Jan. 26, 2004

(86) PCT No.: PCT/JP2004/000665

§ 371 (c)(1),
(2), (4) Date: Jul. 25, 2005

(87) PCT Pub. No.: WO2004/068917

PCT Pub. Date: Aug. 12, 2004

(65) Prior Publication Data

US 2006/0124244 A1 Jun. 15, 2006

(30) Foreign Application Priority Data

Jan. 27, 2003 (JP) ............................ 2003-017673

(51) Int. Cl.
*C23F 1/00* (2006.01)
*H01L 21/306* (2006.01)

(52) U.S. Cl. ........................... 156/345.38; 315/111.21; 118/723 MP; 204/298.08

(58) Field of Classification Search ........... 156/345.35, 156/345.36, 345.38, 345.41, 345.5, 345.51; 315/111.21–111.71; 118/723 R, 723 MW, 118/723 MP; 204/298.08

See application file for complete search history.

(56) References Cited

U.S. PATENT DOCUMENTS

| | | | | |
|---|---|---|---|---|
| 5,900,103 | A * | 5/1999 | Tomoyasu et al. | 156/345.44 |
| 6,238,512 | B1 * | 5/2001 | Li et al. | 156/345.43 |
| 6,290,807 | B1 * | 9/2001 | Matsumoto et al. | 156/345.41 |
| 6,456,010 | B2 * | 9/2002 | Yamakoshi et al. | 315/111.21 |
| 6,544,380 | B2 * | 4/2003 | Tomoyasu et al. | 156/345.51 |
| 2002/0047543 | A1 * | 4/2002 | Sugai et al. | 315/111.21 |

(Continued)

FOREIGN PATENT DOCUMENTS

JP 64-011403 A 1/1989

(Continued)

*Primary Examiner*—Tan Ho
*Assistant Examiner*—Leith A Al-Nazer
(74) *Attorney, Agent, or Firm*—Blakely Sokoloff Taylor & Zafman

(57) ABSTRACT

A plasma processor includes a table on which a target object is to be placed, a vessel which accommodates the table and in which a plasma is to be generated by a high-frequency electromagnetic field, a high-frequency oscillator (30) which generates a high-frequency electromagnetic field, and a reference oscillator (34) which is lower in output power than the high-frequency oscillator (30) and stable in oscillation frequency. A reference signal generated by the reference oscillator (34) is injected into the high-frequency oscillator (30) to fix an oscillation frequency of the high-frequency oscillator (30) at a frequency of a reference signal. Therefore, accurate load matching is performed to improve an energy efficiency when an automatic matching device provided between the high-frequency oscillator (30) and vessel is designed based on the frequency of the reference signal.

17 Claims, 11 Drawing Sheets

U.S. PATENT DOCUMENTS

2002/0113738 A1* 8/2002 Okumura .................... 343/701
2005/0255255 A1* 11/2005 Kawamura et al. ......... 427/569

FOREIGN PATENT DOCUMENTS

JP 10-335095 A 12/1998
JP 2001-274099 A 10/2001
JP 2002-294460 A 10/2002

* cited by examiner

PLASMA PROCESSOR AND PLASMA PROCESSING METHOD

The present patent application is a non-provisional application of International Application No. PCT/JP2004/000665, filed Jan. 26, 2004.

TECHNICAL FIELD

The present invention relates to a plasma processor and plasma processing method and, more particularly, to a plasma processor and plasma processing method which generate a plasma by using a high-frequency electromagnetic field to process a target object such as a semiconductor, LCD (liquid crystal display), organic EL (electro luminescent panel), or the like.

BACKGROUND ART

In the manufacture of a semiconductor device or flat panel display, plasma processors are used often to perform processes such as formation of an oxide film, crystal growth of a semiconductor layer, etching, and ashing. Among the plasma processors, a high-frequency plasma processor is available which supplies a high-frequency electromagnetic field into a processing vessel and ionizes or dissociates a gas in the processing vessel, thus generating a plasma. The high-frequency plasma processor can perform a plasma process efficiently since it can generate a low-pressure, high-density plasma.

FIG. 13 is a view showing the overall structure of a conventional high-frequency plasma processor. This plasma processor has a processing vessel 1001 having an upper opening. A table 1003 to mount a substrate 1004 thereon is fixed to the central portion of the bottom surface of the processing vessel 1001. Exhaust ports 1005 for vacuum evacuation are formed in the peripheral portion of the bottom surface of the processing vessel 1001. A gas introducing nozzle 1006 through which a gas is to be introduced into the processing vessel 1001 is arranged in the side wall of the processing vessel 1001. The upper opening of the processing vessel 1001 is closed by a dielectric plate 1007. A flat antenna 1015 is disposed on the dielectric plate 1007. The flat antenna 1015 is connected to a high-frequency oscillator 1011 through a waveguide 1014.

A high-frequency electromagnetic field generated by the high-frequency oscillator 1011 is supplied into the processing vessel 1001 through the waveguide 1014 and flat antenna 1015. In the processing vessel 1001, the supplied high-frequency electromagnetic field ionizes or dissociates the gas introduced from the nozzle 1006 to generate a plasma, thus processing the substrate 1004.

In the waveguide 1014, the load-side impedance seen from the power supply side changes while the gas is ionized or dissociated to generate the plasma. Even when the impedance is matched between the power source and load before the plasma generation, if the impedance of the load changes by the plasma generation, impedance matching cannot be performed, and the high-frequency electromagnetic field cannot be supplied into the processing vessel 1001 efficiently. In view of this, an automatic matching device which automatically matches the impedance between the power supply side and load side has been proposed.

FIG. 14 is a block diagram showing an arrangement of the automatic matching device. The automatic matching device includes a load matching unit 1016 provided to the waveguide 1014, a driver 1017 for the load matching unit 1016, a detector 1018 similarly provided to the waveguide 1014, and a controller 1019 which controls the driver 1017 for the load matching unit 1016 on the basis of an output signal from the detector 1018.

The load matching unit 1016 includes a plurality of stubs projecting from the inner wall surface of the waveguide 1014 in the radial direction. For example, the load matching unit 1016 includes three stubs disposed in the axial direction of the waveguide 1014 at a pitch of about $\lambda g/4$, and three stubs disposed to oppose the three stubs. Note that $\lambda g$ is the tube wavelength of the high-frequency electromagnetic field propagating in the waveguide 1014. The stubs are metal cylinders. The reactances of the stubs change in accordance with the projection lengths by which the stubs project from the inner wall surface of the waveguide 1014 in the radial direction, and accordingly the reactance in the waveguide 1014 changes. The projection lengths of the stubs can be freely changed by the driver 1017 for the load matching unit 1016.

The detector 1018 includes a plurality of probes projecting from the inner wall surface of the waveguide 1014 in the radial direction. For example, the detector 1018 includes three probes disposed in the axial direction of the waveguide 1014 at a pitch of about $\lambda g/8$. The detector 1018 detects the power of the high-frequency electromagnetic field in the waveguide 1014 which is extracted by the respective probes, and outputs the detection result to the controller 1019.

The controller 1019 calculates the load-side impedance from the output signal of the detector 1018, to obtain the projection lengths of the stubs that satisfy the conditions under which the impedance matches between the power supply side and load side. On the basis of the obtained result, the controller 1019 controls the driver 1017 for the load matching unit 1016 to adjust the projection lengths of the stubs, thus matching the impedance between the power supply side and load side (for example, see International Publication No. 01/76329 pamphlet).

The conventional plasma processor often uses an inexpensive magnetron as the high-frequency oscillator 1011. The magnetron, however, has the following drawbacks.

According to the first drawback, the oscillation frequency distribution of the magnetron has a breadth. Even when the magnetron is operated under the same conditions, a center frequency fc changes as time passes. For example, as shown in FIG. 15A, when the center frequency fc is 2.45 GHz, sometimes the oscillation frequency distribution has a breadth of about ± several ten MHz.

According to the second drawback, the center frequency fc changes in accordance with the output power. For example, as shown in FIG. 15B, even if the center frequency fc is 2.45 GHz when the output power of the magnetron is 1.5 kW, when the output power is changed to 3 kW, sometimes the center frequency fc changes to 2.46 GHz to 2.47 GHz.

If the oscillation frequency distribution of the high-frequency oscillator 1011 has a breadth, the high-frequency electromagnetic field includes a frequency component which is different from the center frequency fc, and accordingly includes a frequency component $\lambda_1$ which is different from the tube wavelength $\lambda g$ of the waveguide 1014 corresponding to the center frequency fc. In addition, when the magnetron is operated for a long period of time or the output power is changed to change the center frequency fc, the distribution of the tube wavelength component of the waveguide 1014 changes accordingly. Consequently, the frequency component $\lambda_1$ which is different from $\lambda g$ increases.

The automatic matching device shown in FIG. 14 is designed with reference to the tube wavelength λg of the waveguide 1014 corresponding to the center frequency fc of the high-frequency oscillator 1011. In the above example, when the probes of the detector 1018 and the stubs of the load matching unit 1016 of the automatic matching device are disposed at the pitches of about λg/8 and λg/4, respectively, appropriate control operation based on an accurate detection result is done to allow impedance matching.

Regarding the frequency component $\lambda_1$ which is different from λg, the probe pitch of the detector 1018 and the stub pitch of the load matching unit 1016 are not $\lambda_1/8$ and $\lambda_1/4$, respectively. For this reason, the detector 1018 outputs a detection result including an error. The controller 1019 obtains impedance matching conditions on the basis of the detection result including the error by setting the stub pitch of the load matching unit 1016 to $\lambda_1/4$. The projection lengths of the respective stubs are adjusted on the basis of the calculation result. Therefore, accurate impedance matching cannot be performed.

If a magnetron which has a breadth in its oscillation frequency distribution and in which the frequency stability is poor is used as the high-frequency oscillator 1011, sometimes the wavelength component $\lambda_1$ which is different from the tube wavelength λg becomes dominant in the high-frequency electromagnetic field. Then, even with an automatic matching device, accurate impedance matching cannot be performed, and the high-frequency electromagnetic field cannot be supplied into the processing vessel 1001 efficiently.

In order to solve this problem, an oscillator which has a narrower frequency band than the magnetron and good frequency stability may be used as the high-frequency oscillator 1011. An example of such an oscillator can include a high-output transistor oscillator, klystron, and the like. These oscillators, however, are more expensive than the magnetron. If such an oscillator is used as the high-frequency oscillator 1011, an inexpensive plasma processor cannot be provided.

DISCLOSURE OF INVENTION

The present invention has been made to solve the above problems, and has as its object to suppress the manufacturing cost of a plasma processor having a high energy efficiency.

In order to achieve the above object, a plasma processor according to the present invention is characterized by comprising a table on which a target object is to be placed, a vessel which accommodates the table and in which a plasma is to be generated by a high-frequency electromagnetic field, a high-frequency oscillator which generates the high-frequency electromagnetic field, and a reference oscillator which is lower in output power than the high-frequency oscillator and stable in oscillation frequency, wherein a reference signal generated by the reference oscillator is injected into the high-frequency oscillator to fix an oscillation frequency of the high-frequency oscillator to a frequency of the reference signal.

The present invention is also characterized by comprising the steps of generating a reference signal by a reference oscillator which is lower in output power than a high-frequency oscillator that generates a high-frequency electromagnetic field and stable in oscillation frequency, injecting the reference signal into the high-frequency oscillator to fix an oscillation frequency of the high-frequency oscillator to a frequency of the reference signal, supplying the high-frequency electromagnetic field generated by the high-frequency oscillator into a vessel to generate a plasma, and processing a target object arranged in the vessel by using the plasma.

BEST MODE FOR CARRYING OUT THE INVENTION

The embodiments of the present invention will be described in detail with reference to the accompanying drawings.

(First Embodiment)

Figure 1:
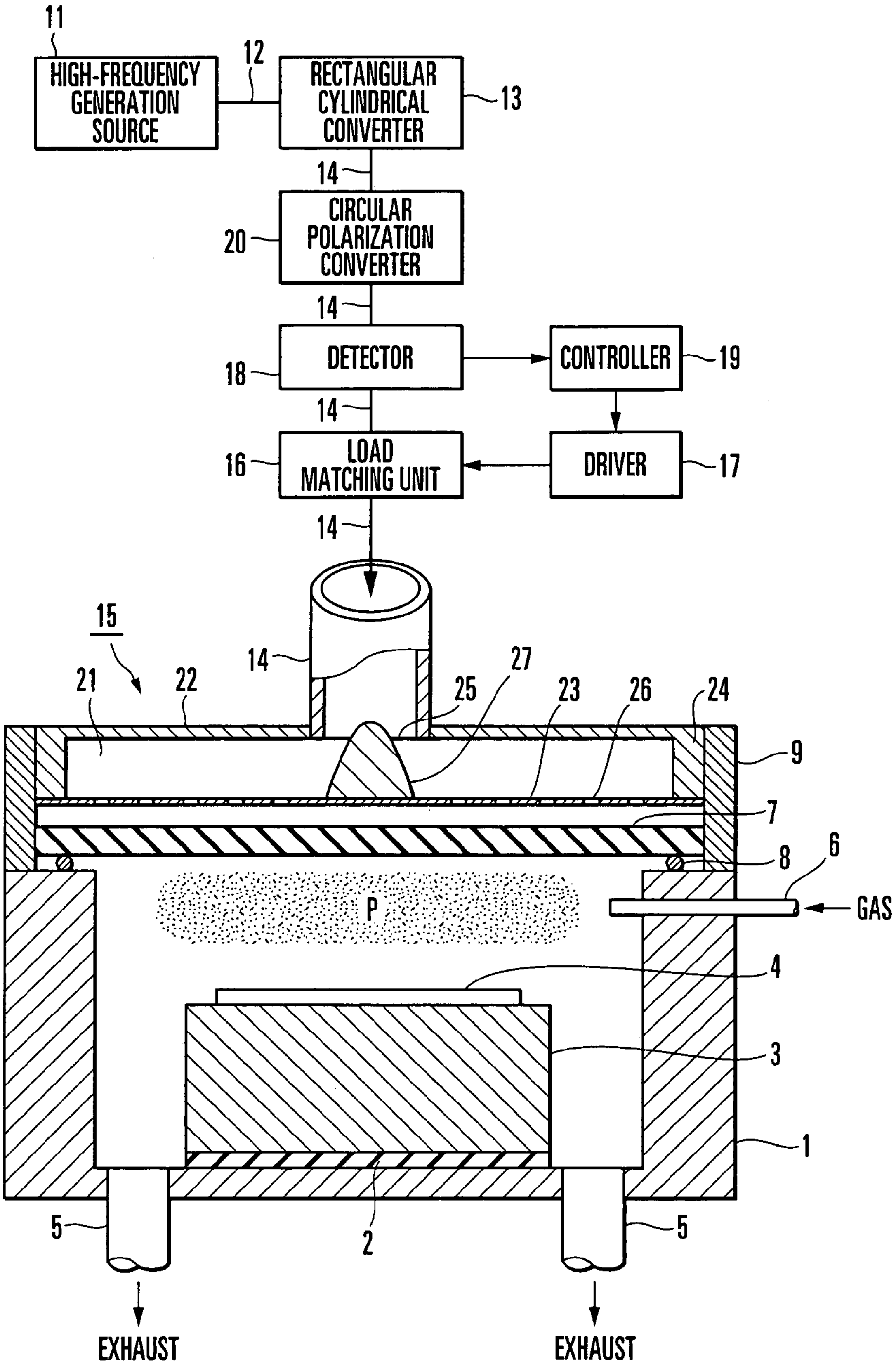
FIG. 1 is a view showing the overall structure of a plasma processor according to the first embodiment of the present invention.

FIG. 1 is a view showing the overall structure of a plasma processor according to the first embodiment of the present invention. FIG. 1 shows some of the structure by way of functional blocks.

The plasma processor shown in FIG. 1 has a bottomed cylindrical processing vessel 1 having an upper opening. A table 3 is fixed to the central portion of the bottom surface of the processing vessel 1 through an insulating plate 2. A substrate 4 such as a semiconductor, LCD, or the like is placed as a target object on the upper surface of the table 3. Exhaust ports 5 for vacuum evacuation are formed in the peripheral portion of the bottom surface of the processing vessel 1. A gas introducing nozzle 6 through which a gas is to be introduced into the processing vessel 1 is arranged in the side wall of the processing vessel 1. When the plasma processor is to be used as, e.g., an etching apparatus, a plasma gas such as Ar and an etching gas such as $CF_4$ are introduced through the nozzle 6.

The upper opening of the processing vessel 1 is closed by a dielectric plate 7 so, while a high-frequency electromagnetic field is introduced through the upper opening, a plasma P generated in the processing vessel 1 does not leak outside. A seal member 8 such as an O-ring is interposed between the upper surface of the side wall of the processing vessel 1 and the dielectric plate 7 to ensure the hermeticity in the processing vessel 1.

The antenna (second antenna) of an electromagnetic field supply device which supplies the high-frequency electromagnetic field into the processing vessel 1 is arranged on the dielectric plate 7 to oppose the table 3. In this embodiment, the second antenna is exemplified by a radial line slot antenna (RLSA) 15. The RLSA 15 is isolated from the processing vessel 1 by the dielectric plate 7 and accordingly protected from the plasma P. The outer surfaces of the dielectric plate 7 and RLSA 15 are covered with a shield material 9 annularly arranged on the side wall of the processing vessel 1. Thus, the high-frequency electromagnetic field supplied from the RLSA 15 into the processing vessel 1 will not leak outside.

The electromagnetic field supply device has a high-frequency generation source 11, a rectangular waveguide 12 connected to the high-frequency generation source 11, a rectangular cylindrical converter 13 connected to the rectangular waveguide 12, a cylindrical waveguide 14 connected to the rectangular cylindrical converter 13, and the RLSA 15 connected to the cylindrical waveguide 14. The waveguides 12 and 14 have transmission modes $TE_{10}$ and $TE_{11}$, respectively. The rectangular cylindrical converter 13 converts the transmission mode from $TE_{10}$ to $TE_{11}$. The rectangular waveguide 12, rectangular cylindrical converter 13, and cylindrical waveguide 14 make up the first waveguide. A detector 18 and load matching unit 16 of an automatic matching device (to be described later) are arranged on the cylindrical waveguide 14 in this order from the upper side. A circular polarization converter 20 may be further arranged between the rectangular cylindrical converter 13 and detector 18 to set the electromagnetic field in the rotation mode.

The RLSA 15 will be described. The RLSA 15 has two parallel circular conductor plates 22 and 23 which form a radial waveguide 21, and a conductor ring 24 which connects the edge portions of the two conductor plates 22 and 23 so that they are shielded. An opening 25 to be connected to the cylindrical waveguide 14 is formed at the central portion of the conductor plate 22 serving as the upper surface of the radial waveguide 21. A high-frequency electromagnetic field is introduced into the radial waveguide 21 through the opening 25. A plurality of slots 26, through which the high-frequency electromagnetic field propagating in the radial waveguide 21 is to be supplied into the processing vessel 1 through the dielectric plate 7, are formed in the conductor plate 23 serving as the lower surface of the radial waveguide 21.

A bump 27 is provided to the central portion on the conductor plate 23. The bump 27 is formed to have an almost circular conical shape projecting toward the opening 25 of the conductor plate 22, and its distal end is rounded spherically. The bump 27 can be made of either a conductor or dielectric. With the bump 27, a change in impedance from the cylindrical waveguide 14 to the radial waveguide 21 is moderated, and accordingly the reflection of the high-frequency electromagnetic field at the connecting portion of the cylindrical waveguide 14 and radial waveguide 21 can be suppressed.

The automatic matching device will be described. The automatic matching device includes a load matching unit 16 arranged on the cylindrical waveguide 14, a driver 17 for the load matching unit 16, the detector 18 similarly arranged on the cylindrical waveguide 14, and a controller 19 which controls the driver 17 for the load matching unit 16 on the basis of an output signal from the detector 18.

Figure 2:
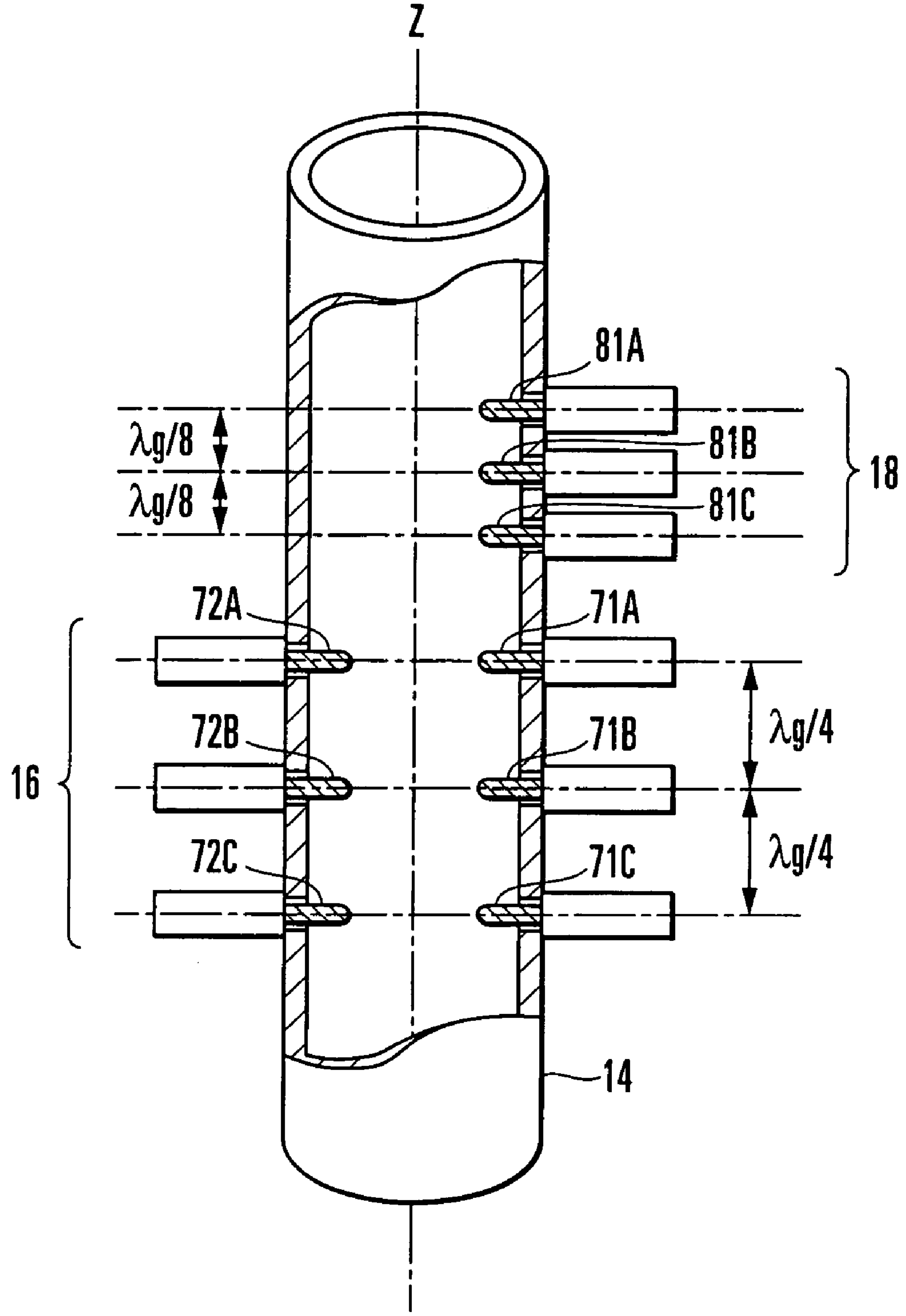
FIG. 2 is a view showing an arrangement of a load matching unit and detector.

FIG. 2 is a view showing an arrangement of the load matching unit 16 and detector 18, and shows a section that includes the axis (Z) of the cylindrical waveguide 14 where the load matching unit 16 and detector 18 are provided.

The load matching unit 16 includes a plurality of stubs projecting from the inner wall surface of the cylindrical waveguide 14 in the radial direction. For example, the load matching unit 16 includes three stubs 71A, 71B, and 71C disposed in the direction of the axis (Z) of the waveguide 14 at a pitch of about λg/4, and three stubs 72A, 72B, and 72C disposed to oppose the three stubs 71A, 71B, and 71C. The stubs can be disposed at a pitch of about λg/8. Note that λg is the tube wavelength of the high-frequency electromagnetic field propagating in the cylindrical waveguide 14, and corresponds to the frequency of a reference signal (to be described later) (this applies to the following description as well).

The stubs are metal or dielectric cylinders. The reactances of the stubs change in accordance with the projection lengths by which the stubs project from the inner wall surface of the cylindrical waveguide 14 in the radial direction, and accordingly the reactance in the cylindrical waveguide 14 changes. The projection lengths of the stubs can be freely changed by the driver 17 for the load matching unit 16.

The detector 18 includes a plurality of probes projecting from the inner wall surface of the cylindrical waveguide 14 in the radial direction. For example, the detector 18 includes three probes 81A, 81B, and 81C disposed in the direction of the axis (Z) of the cylindrical waveguide 14 at a pitch of about λg/8. It suffices as far as three or more probes are provided at a pitch of other than λg×N/2 (where N is a natural number). The detector 18 having this structure detects the power of the high-frequency electromagnetic field in the cylindrical waveguide 14 which is extracted by the respective probes by square-law detection, and outputs the detection result to the controller 19.

The controller 19 calculates the load-side impedance from the output signal of the detector 18, to obtain the projection lengths of the stubs that satisfy the conditions under which the impedance matches between the power supply side and load side. On the basis of the obtained result, the controller 19 controls the driver 17 for the load matching unit 16 to adjust the projection lengths of the stubs, thus matching the impedance between the power supply side and load side.

Figure 3:
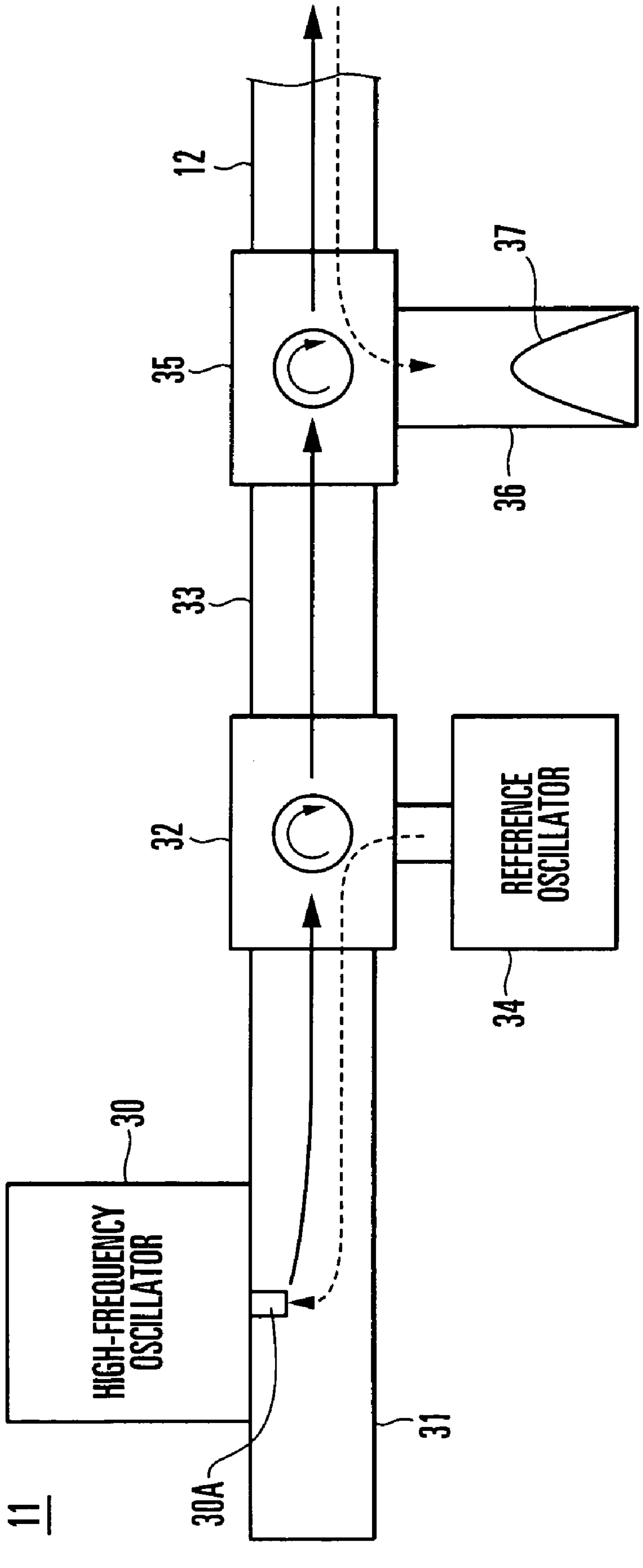
FIG. 3 is a view showing the concept of an arrangement of a high-frequency generation source.

The high-frequency generation source 11 will be described. FIG. 3 is a view showing the concept of an arrangement of the high-frequency generation source 11. The high-frequency generation source 11 shown in FIG. 3 has a high-frequency oscillator 30, a launcher 31 for the oscillator 30, a three-terminal circulator 32, a rectangular waveguide 33, a reference oscillator 34, a three-terminal circulator 35, and a dummy load 36.

The high-frequency oscillator 30 is an oscillator that generates a high-frequency electromagnetic field having a predetermined frequency in the range of, e.g., 0.9 GHz to ten-odd GHz, and is formed of a magnetron or the like.

Alternatively, an oscillator which generates a high-frequency electromagnetic field of 0.9 GHz or less can be used.

The high-frequency oscillator 30 is disposed on the launcher 31. The launcher 31 is formed of a rectangular waveguide (second waveguide) having one short-circuited end. A probe (first antenna) 30A of the high-frequency oscillator 30 projects into the launcher 31, and radiates a high-frequency electromagnetic field.

The other end of the launcher 31 is connected to the first terminal of the three-terminal circulator 32. The second and third terminals of the circulator 32 are connected to one end of the rectangular waveguide 33 and the reference oscillator 34, respectively.

The other end of the rectangular waveguide 33 is connected to the first terminal of the three-terminal circulator 35. The second and third terminals of the circulator 35 are connected to the rectangular waveguide 12 shown in FIG. 1 and the dummy load 36, respectively.

The circulators 32 and 35 are passive elements in which input powers from the first, second, and third terminals are transmitted to the second, third, and first terminals, respectively, with no loss.

As the reference oscillator 34, an oscillator which is lower in output power than the high-frequency oscillator 30 and stable in oscillation frequency is used. When the output power of the high-frequency oscillator 30 is 1 kW, a dielectric oscillator (DRO) having an output power of, e.g., about 10 W, can be used. The higher the output power of an oscillator, the higher the cost of the oscillator. Hence, the lower the output power of the reference oscillator 34, the better. The frequency of the reference signal generated by the reference oscillator 34 is set at a desired frequency to which the oscillation frequency of the high-frequency oscillator 30 is to be fixed. For example, when the oscillation frequency of the high-frequency oscillator 30 is to be fixed to 2.45 GHz, a 2.45-GHz reference signal is used.

An electromagnetic field absorbing material 37 is disposed at the end portion of the dummy load 36. As the electromagnetic field absorbing material 37, for example, a conical one containing water is used.

In the high-frequency generation source 11 having the above structure, the high-frequency electromagnetic field radiated from the probe 30A of the high-frequency oscillator 30 into the launcher 31 is sent to the rectangular waveguide 33 by the circulator 32, then to the rectangular waveguide 12 shown in FIG. 1 by the circulator 35, and introduced into the RLSA 15 through the rectangular cylindrical converter 13 and cylindrical waveguide 14. The high-frequency electromagnetic field, while propagating radially from the central portion to the peripheral portion of the radial waveguide 21, is gradually supplied into the processing vessel 1 through the plurality of slots 26 formed in the lower surface of the radial waveguide 21. In the processing vessel 1, the supplied high-frequency electromagnetic field ionizes or dissociates the plasma gas introduced through the nozzle 6 to generate the plasma P, thus processing the substrate 4.

Figure 15A:
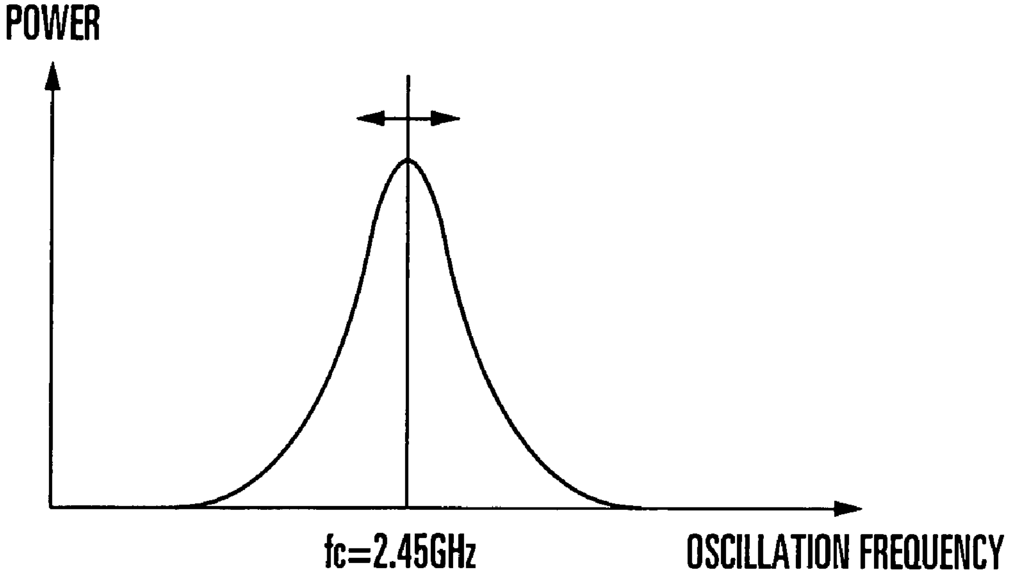
FIGS. 15A and 15B are graphs showing the output characteristics of the magnetron.
Figure 15B:
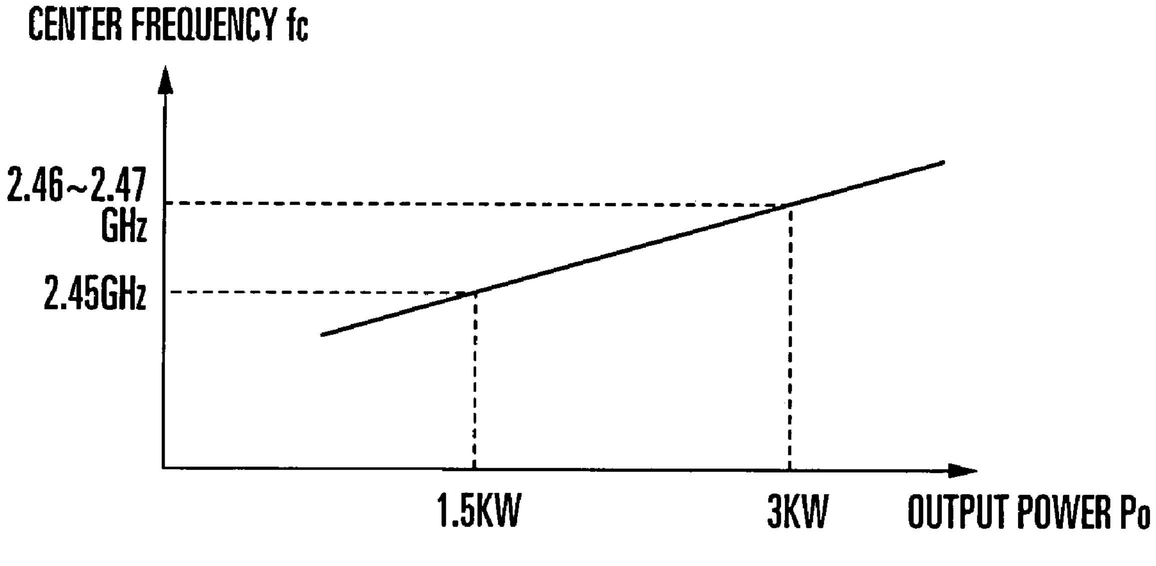

The reference signal generated by the reference oscillator 34 is sent to the launcher 31 by the circulator 32 and injected into the high-frequency oscillator 30 through the probe 30A. When the reference signal is injected into the high-frequency oscillator 30, if a center frequency fc of the high-frequency oscillator 30 is close to the frequency of the reference signal, the oscillation frequency of the high-frequency oscillator 30 changes to the frequency of the reference signal and fixed to it. Thus, as shown in FIG. 15A, even when the oscillation frequency distribution of the high-frequency oscillator 30 has a breadth, the oscillation frequency converges to the frequency of the reference signal, so that the frequency band of the oscillation frequency becomes narrow. As the reference signal has good frequency stability, when the oscillation frequency of the high-frequency oscillator 30 is fixed to the reference signal, the oscillation frequency of the high-frequency oscillator 30 is also stabilized. As a result, of the oscillation frequency of the high-frequency oscillator 30, a frequency component which is different from the frequency of the reference signal is decreased.

A frequency width (to be referred to as a frequency fixing width) Δf of the oscillation frequency of the high-frequency oscillator 30 which can be fixed to a frequency f of the reference signal by the method described above is expressed by equation (1):

$$\Delta f/f = 2/Q_E \cdot (P_1/P_0)^{1/2} \ldots \quad (1)$$

where f is the frequency of the reference signal, $P_i$ is the power of the reference signal to be injected into the high-frequency oscillator 30, $P_0$ is the output power of the high-frequency oscillator 30, and $Q_E$ is the external Q value of the high-frequency oscillator 30.

Therefore, a high-frequency oscillator 30 with which the difference between the original center frequency fc of the high-frequency oscillator 30 and the frequency of the reference signal does not exceed the frequency fixing width Δf must be selected.

The high-frequency electromagnetic field which is reflected by the RLSA 15 is sent to the dummy load 36 by the circulator 35 and absorbed by the electromagnetic field absorbing material 37. Accordingly, the high-frequency electromagnetic field reflected by the RLSA 15 can be prevented from being set to the reference oscillator 34 by the circulator 32 to cause erroneous operation of the reference oscillator 34 can be prevented. The arrangement formed of the circulator 35 and dummy load 36 may be provided to the cylindrical waveguide 14.

According to this embodiment, the automatic matching device is designed on the basis of the frequency of the reference signal. More specifically, the probes of the detector 18 and the stubs of the load matching unit 16 are disposed in the direction of the axis (Z) of the cylindrical waveguide 14 at the pitches of about λg/8 and λg/4, respectively, with respect to the tube wavelength λg of the cylindrical waveguide 14 corresponding to the frequency of the reference signal. Therefore, when the oscillation frequency of the high-frequency oscillator 30 is fixed to the frequency of the reference signal and, of the oscillation frequency of the high-frequency oscillator 30, a frequency component which is different from the frequency of the reference signal is decreased, even if the load-side impedance changes during generation of the plasma P, impedance matching between the load side and power supply side can be performed accurately. As a result, the high-frequency electromagnetic field can be supplied into the processing vessel 1 efficiently throughout the generation of the plasma P, and the energy efficiency of the plasma processor can be improved.

When the oscillation frequency of the high-frequency oscillator 30 formed of a high-output magnetron or the like is fixed to a predetermined frequency by using the reference oscillator 34, the high-frequency oscillator 30 need not be formed of an expensive oscillator such as a high-output transistor oscillator. An oscillator, e.g., a DRO, having good frequency stability is inexpensive if its output power is as low as about 10 W. When such an inexpensive oscillator is used as the reference oscillator 34, the effect described above, i.e., an improvement in energy efficiency, can be obtained while suppressing the manufacturing cost of the plasma processor.

The first embodiment shows a case wherein the first waveguide which guides the high-frequency electromagnetic field from the high-frequency generation source 11 to the processing vessel 1 is formed of the rectangular waveguide 12, rectangular cylindrical converter 13, and cylindrical waveguide 14. Alternatively, the high-frequency electromagnetic field from the high-frequency generation source 11 may be guided to the processing vessel 1 through only a waveguide line such as a coaxial cable. The high-frequency electromagnetic field may be guided from the high-frequency generation source 11 halfway through a waveguide line such as a coaxial waveguide, and after that to the processing vessel 1 through a waveguide such as a coaxial waveguide. Namely, the first waveguide is formed of a waveguide, a waveguide line, or a waveguide and waveguide line that are connected in series.

In the first embodiment, the second waveguide that guides the reference signal from the reference oscillator 34 to the high-frequency oscillator 30 includes the launcher 31 formed of a rectangular waveguide. Alternatively, the second waveguide can include, other than a waveguide (e.g., a rectangular waveguide, cylindrical waveguide, or coaxial waveguide), a waveguide line (e.g., a coaxial cable), or a waveguide and waveguide line that are connected in series.

(Second Embodiment)

A plasma processor according to the second embodiment of the present invention has a high-frequency generation source which is stable in oscillation frequency and variable in output power.

Figure 4:
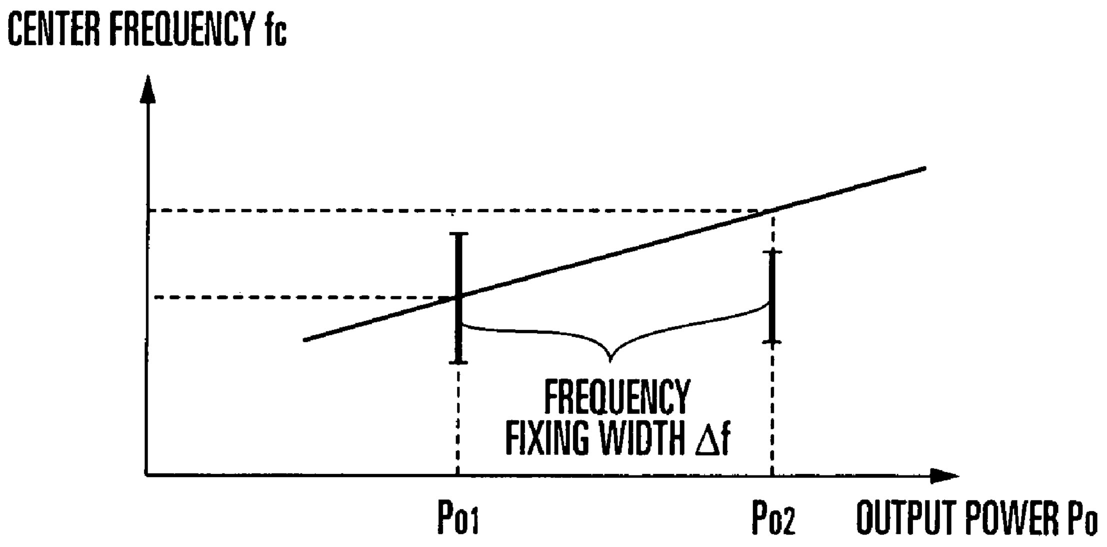
FIG. 4 is a graph showing the output characteristics of a magnetron and a frequency fixing width.

To change the output power of the high-frequency generation source 11 shown in FIG. 3, the output power $P_0$ of the high-frequency oscillator 30 may be changed. When, however, the high-frequency oscillator 30 includes a magnetron or the like, if the output power $P_0$ is changed, the center frequency fc changes accordingly, as shown in FIG. 4. As apparent from equation (1), when the frequency f and power $P_i$ of the reference signal injected to the high-frequency oscillator 30 are constant, if the output power $P_0$ of the high-frequency oscillator 30 increases, the frequency width (frequency fixed width) Δf of the oscillation frequency of the high-frequency oscillator which can be fixed to the frequency f of the reference signal decreases. For this reason, as shown in FIG. 4, even if the frequency can be fixed when the output power $P_0$ of the high-frequency oscillator 30 is $P_{01}$, if the output power $P_0$ is changed to $P_{02}$ which is larger than $P_{01}$, the difference between the original center frequency fc of the high-frequency oscillator 1 and the frequency f of the reference signal increases to exceed the frequency fixing width Δf. Then, the oscillation frequency cannot be fixed, and sometimes the oscillation frequency becomes unstable. In view of this, a high-frequency generation source which is stable in oscillation frequency and variable in output power will be described.

Figure 5:
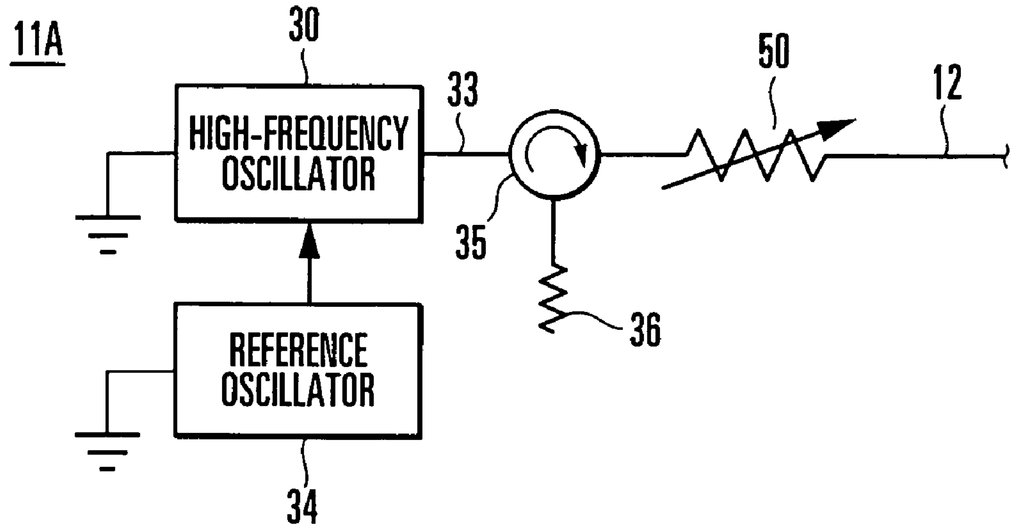
FIG. 5 is a view showing the structure of the main part of a plasma processor according to the second embodiment of the present invention.

FIG. 5 is a view showing the structure of this high-frequency generation source. In FIG. 5, the constituent elements that correspond to those shown in FIG. 1 will be denoted by the same reference numerals as in FIG. 1.

In a high-frequency generation source 11A shown in FIG. 5, a high-frequency oscillator 30 having sufficiently high output power is used, and the second terminal of a circulator 35 is connected to the input terminal of an attenuator 50 the attenuation amount of which is variable. The output terminal of the attenuator 50 is connected to the rectangular waveguide 12 shown in FIG. 1.

When the attenuation amount of the attenuator 50 is changed, the power of the high-frequency electromagnetic field to be output to the rectangular waveguide 12 changes accordingly. As the output power of the high-frequency oscillator 30 need not be changed, the frequency fixing width Δf does not change, and fixing of the oscillation frequency is maintained. Therefore, with the high-frequency generation source 11A, the output power can be changed while the oscillation frequency is stable.

Figure 6A:
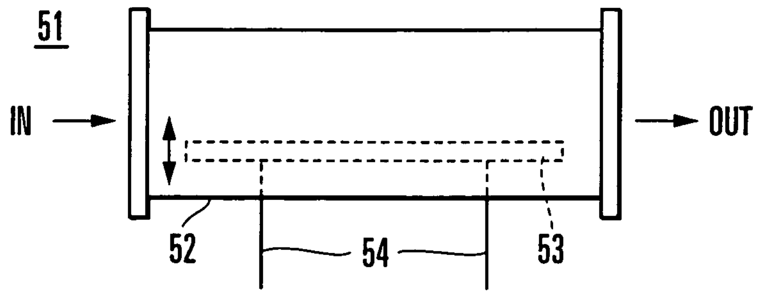
FIGS. 6A and 6B are views showing an arrangement of an attenuator.
Figure 6B:
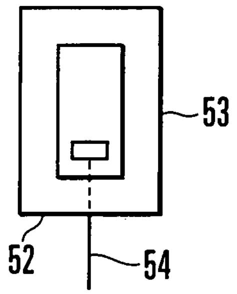
Figure 7:
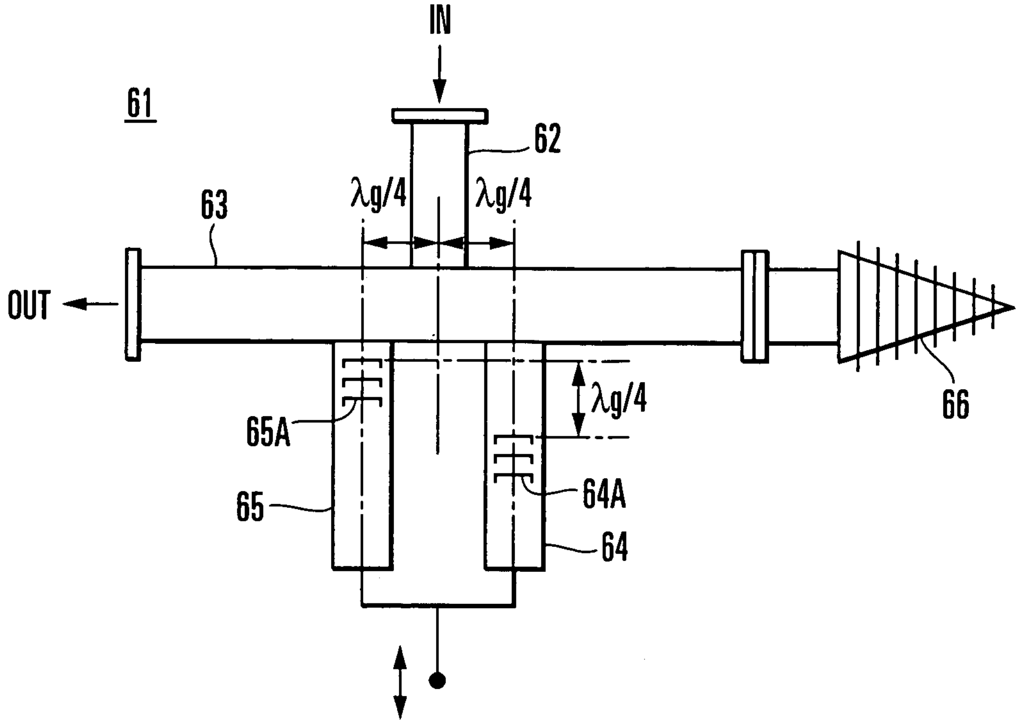
FIG. 7 is a view showing another arrangement of the attenuator.

FIGS. 6A, 6B, and 7 are views showing arrangements of the attenuator 50. A resistor insertion type attenuator 51 shown in FIGS. 6A and 6B is obtained by inserting a plate-like resistor 53 in a rectangular waveguide 52. The resistor 53, while being arranged parallel to the E surface (a narrow tube wall parallel to the electric field) of the rectangular waveguide 52, is attached to support rods 54 extending through the E surface. The field strength in the rectangular waveguide 52 is higher at a portion farther from the E surface in the vertical direction. When the support rods 54 are moved in this direction to change the distance between the resistor 53 and E surface, the attenuation amount of the high-frequency electromagnetic field which travels through the rectangular waveguide 52 can be changed.

In a T-branch distribution type attenuator 61 shown in FIG. 7, one end of a rectangular waveguide 62 is connected to the side wall of a rectangular waveguide 63. One end of a branched waveguide 64 and one end of a branched waveguide 65 are also connected to the side wall of the rectangular waveguide 63 to be symmetrical with respect to the center axis of the rectangular waveguide 62. One end of the rectangular waveguide 63A is connected to a dummy load 66. The distances between the center axis of the rectangular waveguide 62 and the center axes of the branched waveguides 64 and 65 are each λg/4. The other end of the branched waveguide 64 and the other end of the branched waveguide 65 are electro-functionally short-circuited by short-circuiting plates 64A and 65A, respectively. When the two short-circuiting plates 64A and 65A are slid in the branched waveguides 64 and 65 while holding the distances of λg/4 in the axial directions of the branched waveguides 64 and 65, the proportion in which the high-frequency electromagnetic field input from the other end of the rectangular waveguide 62 is branched into one end and the other end of the rectangular waveguide 63 changes. Consequently, the attenuation amount of the high-frequency electromagnetic field output from the other end of the rectangular waveguide 63 can be changed.

(Third Embodiment)

A plasma processor according to the third embodiment of the present invention has a high-output, frequency-stable high-frequency generation source that can be realized at a low cost.

As apparent from equation (1), the higher the output power $P_0$ of the high-frequency oscillator with respect to the power $P_i$ of the reference signal injected into the high-frequency oscillator, the narrower the frequency width (frequency fixed width) Δf of the oscillation frequency of the high-frequency oscillator that can be fixed to the frequency f of the reference signal. Therefore, when the oscillation frequency of the high-output high-frequency oscillator is fixed by using a low-output reference oscillator, frequency fixing cannot be maintained with only slight fluctuations of the center frequency fc of the high-output high-frequency oscillator, and stable frequency fixing becomes impossible.

When the oscillation frequency of the high-output high-frequency oscillator is fixed by using a high-output reference oscillator, stable frequency fixing can be performed. A high-output reference oscillator, e.g., a DRO, is very expensive. In view of this, a high-output, frequency-stable high-frequency generation source that does not use a high-output reference oscillator will be described.

Figure 8:
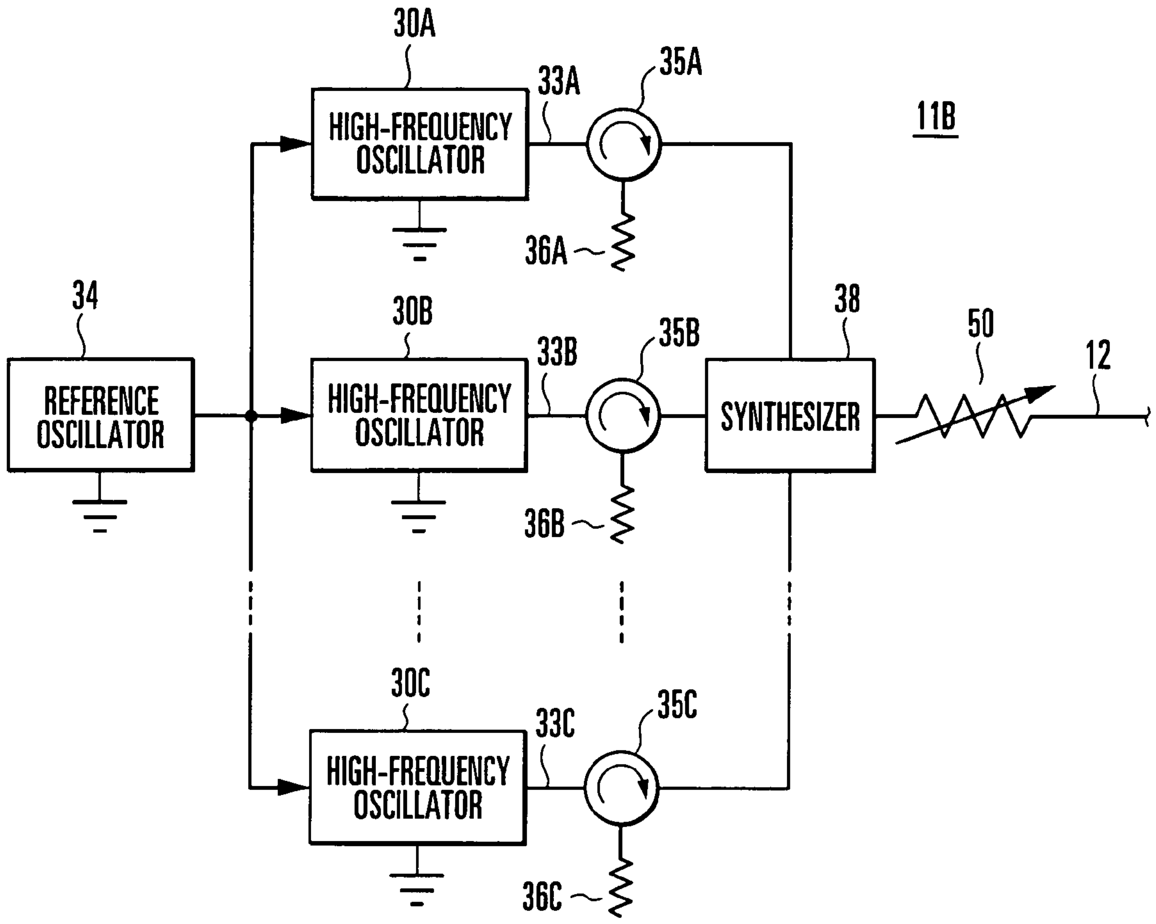
FIG. 8 is a view showing the structure of the main part of a plasma processor according to the third embodiment of the present invention.

FIG. 8 shows the structure of this high-frequency generation source. In FIG. 8, the constituent elements that correspond to those shown in FIGS. 1 and 5 will be denoted by the same reference numerals as in FIGS. 1 and 5.

A high-frequency generation source 11B shown in FIG. 8 has a plurality of high-frequency oscillators formed of magnetrons or the like. Upon injection of a reference signal generated by a reference oscillator 34, the oscillation frequencies of the high-frequency oscillators 30A, 30B, . . . , and 30C are all fixed to the frequency of the reference signal. High-frequency electromagnetic fields generated by the high-frequency oscillators 30A to 30C are synthesized by a synthesizer 38. The synthesized high-frequency electromagnetic field is output to the rectangular waveguide 12 shown in FIG. 1.

In this manner, when the plurality of high-frequency oscillators 30A to 30C are provided and their output powers are synthesized, output power equal to that obtained when one high-output oscillator is used can be obtained by using a plurality of low-output oscillators. As the high-frequency oscillators 30A to 30C are used as the low-output oscillators, a wide frequency fixed width Δf can be obtained even when a low-output oscillator is used as the reference oscillator 34. Even when the center frequencies of the high-frequency oscillators 30A to 30C fluctuate more or less, frequency fixing can be maintained, and stable frequency fixing is possible. No expensive high-output reference oscillator need be used to realize a high-output, frequency-table high-frequency generation source. As a result, the manufacturing cost of the high-frequency generation source and of a plasma processor that uses it can be suppressed.

Even when the plurality of high-frequency oscillators 30A to 30C are provided, they need not be always operated simultaneously. For example, when the output powers of the high-frequency oscillators 30A to 30C are 1 kW, and 1.9-kW power is to be supplied, only the two high-frequency oscillators 30A and 30B are operated and the remaining high-frequency oscillators are stopped. An attenuator 50 is adjusted to attenuate the output power from 2.0 kW to 1.9 kW. This reduces power consumption of the stopped high-frequency oscillators. Accordingly, the running cost becomes lower than that required when one high-output high-frequency oscillator is used.

The reference oscillator 34 may be provided to the plurality of high-frequency oscillators in common, or to each of the high-frequency oscillators 30A to 30C individually. The output powers of the high-frequency oscillators 30A to 30C may be equal or different. The arrangement formed of a circulator 35 and dummy load 36 may be provided to the plurality of high-frequency oscillators in common, or to each of the high-frequency oscillators 30A to 30C individually.

(Fourth Embodiment)

A plasma processor according to the fourth embodiment of the present invention has a high-output, frequency-stable high-frequency generation source that can be realized at a low cost.

Figure 9:
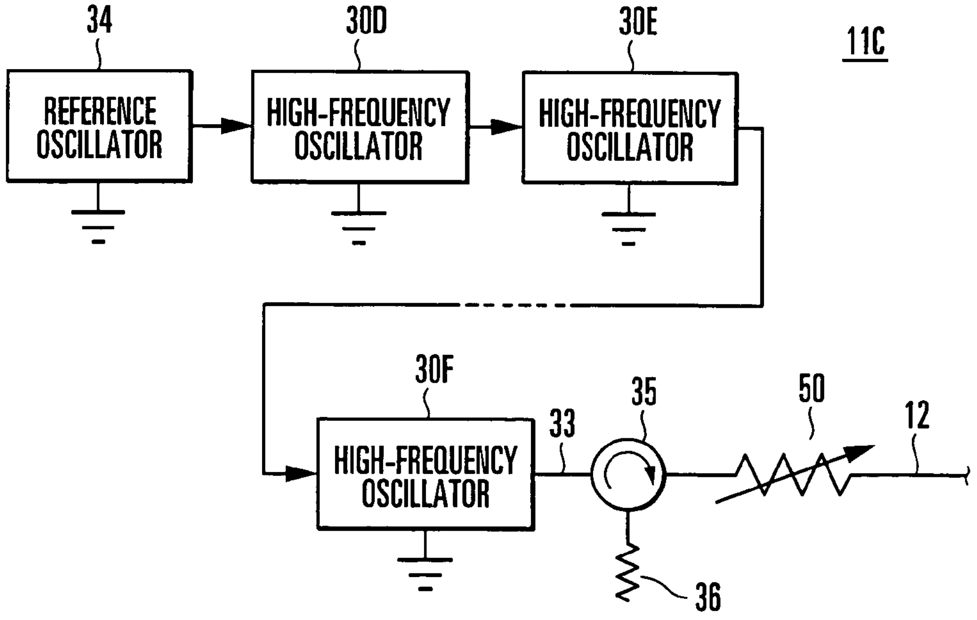
FIG. 9 is a view showing the structure of the main part of a plasma processor according to the fourth embodiment of the present invention.

FIG. 9 shows the structure of this high-frequency generation source. In FIG. 9, the constituent elements that correspond to those shown in FIGS. 1 and 5 will be denoted by the same reference numerals as in FIGS. 1 and 5.

A high-frequency generation source 11C shown in FIG. 9 has a plurality of high-frequency oscillators formed of magnetrons or the like. These high-frequency oscillators 30D, 30E, . . . , and 30F have different output powers and are cascade-connected in the output power increasing order. More specifically, $$P_{0D} < P_{0E} < \ldots < P_{0F}$$

is established where $P_{0D}$ is the output power of the first-stage high-frequency oscillator 30D, $P_{0E}$ is the output power of the second-stage high-frequency oscillator 30E, and $P_{0F}$ is the output power of the last-stage high-frequency oscillator 30F. The first-stage high-frequency oscillator 30D is connected to a reference oscillator 34, and a reference signal generated by the reference oscillator 34 is injected to the high-frequency oscillator 30D. A high-frequency electromagnetic field generated by a previous-stage high-frequency oscillator is injected into each of the remaining high-frequency oscillators. The last-stage high-frequency oscillator 30F is connected to the rectangular waveguide 12 shown in FIG. 1 through a rectangular waveguide 33, circulator 35, and high-frequency oscillator 30.

When the center frequencies of all the high-frequency oscillators 30D to 30F are close to the frequency of the reference signal, upon injection of the reference signal, the oscillation frequency of the first-stage high-frequency oscillator 30D is fixed to the frequency of the reference signal. Upon injection of the high-frequency electromagnetic field generated by the high-frequency oscillator 30D, the oscillation frequency of the high-frequency oscillator 30E which is on the next stage of the high-frequency oscillator 30D is fixed to the frequency of this high-frequency electromagnetic field, i.e., the frequency of the reference signal. In this manner, the oscillation frequencies of all the high-frequency oscillators 30D to 30F are fixed to the frequency of the reference signal in a chained manner.

As described above, when the plurality of high-frequency oscillators 30D to 30F are cascade-connected in the output power increasing order and the oscillation frequencies are fixed on the plurality of stages, wide frequency fixing widths Δf can be obtained at the respective stages. Even when the center frequencies of the high-frequency oscillators of the respective stages fluctuate more or less, frequency fixing can be maintained. Accordingly, when the oscillation frequency of the high-output high-frequency oscillator 30F is to be fixed by using the low-output reference oscillator 34 as well, stable frequency fixing becomes possible. No expensive high-output reference oscillator need be used to realize a high-output, frequency-stable high-frequency generation source. As a result, the manufacturing cost of the high-frequency generation source and of a plasma processor that uses it can be suppressed.

(Fifth Embodiments)

Figure 10:
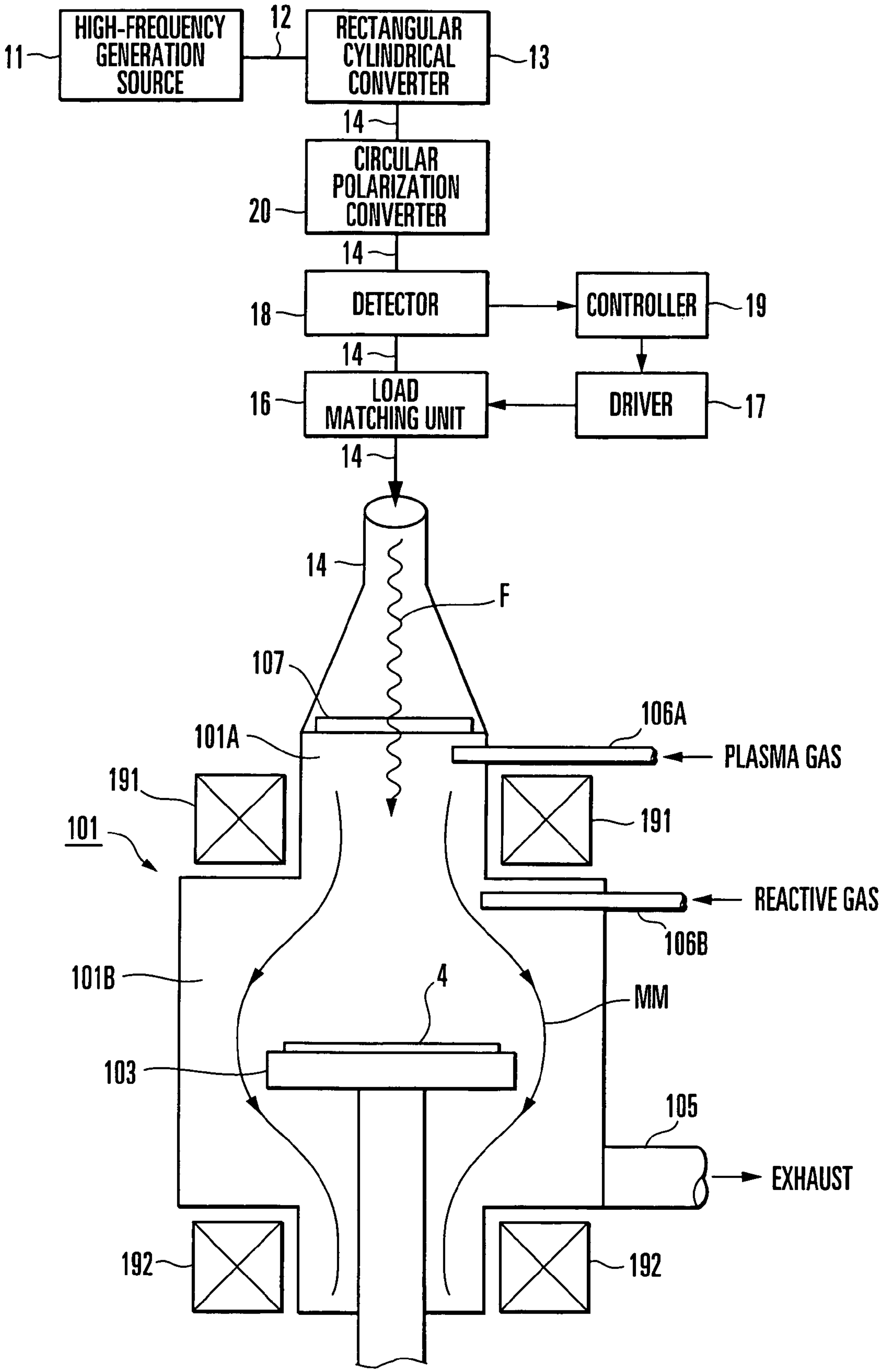
FIG. 10 is a view showing the structure of the main part of a plasma processor according to the fifth embodiment of the present invention.

The present invention can be applied not only to the high-frequency plasma processors described above but also to an electron-cyclotron-resonance (ECR) plasma processor. FIG. 10 is a view showing an arrangement of an ECR plasma processor to which the present invention is applied. In FIG. 10, the constituent elements that correspond to those shown in FIG. 1 are denoted by the same reference numerals as in FIG. 1.

The ECR plasma processor shown in FIG. 10 has a vessel 101 including a plasma chamber 101A where a plasma is generated and a reaction chamber 101B where a process such as plasma CVD is performed.

A main electromagnetic coil 191 which forms a magnetic field with a magnetic flux density B of 87.5 mT in the plasma chamber 101A is arranged around the plasma chamber 101A. The upper end of the plasma chamber 101A is connected to one end of a cylindrical waveguide 14 through a dielectric plate 107. The cylindrical waveguide 14 supplies a high-frequency electromagnetic field F having a frequency equal to an electron cyclotron frequency (a frequency with which electrons in the plasma rotate about a line of magnetic force) of 2.45 GHz.

The reaction chamber 101B communicating with the plasma chamber 101A accommodates a table 103 with an upper surface where a Si substrate 4 as a target object is to be placed. An auxiliary electromagnetic coil 192 is arranged under the bottom surface of the reaction chamber 101B. A magnetic field generator including the main electromagnetic coil 191 and auxiliary electromagnetic coil 192 forms a mirror field MM in the reaction chamber 101B.

A nozzle 106A through which a plasma gas such as $N_2$ is supplied is arranged in the upper portion of the plasma chamber 101A. A nozzle 106B through which a reactive gas such as $SiH_4$ is supplied is arranged in the upper portion of the reaction chamber 101B. Furthermore, an exhaust port 105 communicating with a vacuum pump is arranged in the lower portion of the reaction chamber 101B.

In this structure, when a magnetic field having the magnetic flux density B of 87.5 mT is formed in the plasma chamber 101A and the high-frequency electromagnetic field F having a frequency of 2.45 GHz is introduced into the plasma chamber 101A, electron cyclotron resonance occurs, and the energy of the high-frequency electromagnetic field F efficiently shifts to the electrons to heat them. The electrons heated by the high-frequency electromagnetic field F in this manner ionize or dissociate $N_2$ in the plasma chamber 101A to generate a plasma.

Figure 14:
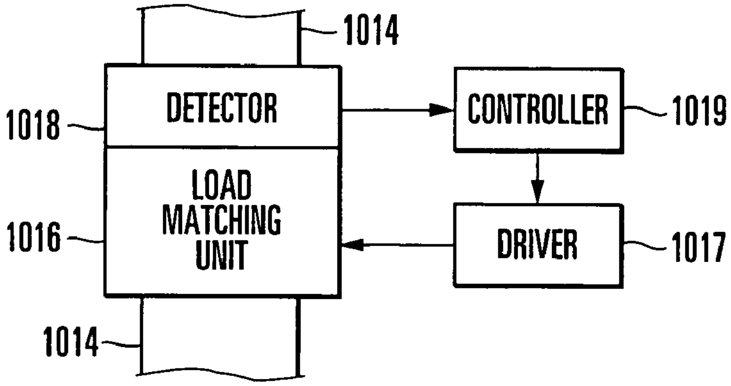
FIG. 14 is a block diagram showing an arrangement of an automatic matching device.

One end of the cylindrical waveguide 14 is connected to the plasma chamber 101A, and its other end is connected to a high-frequency generation source 11 through a rectangular cylindrical converter 13 and rectangular waveguide 12. The high-frequency generation source 11 is identical to that shown in FIG. 3. An automatic matching device which is similar to that shown in FIG. 14 and includes a load matching unit 16, a driver 17 for the load matching unit 16, a detector 18, and a controller 19 is also provided to the high-frequency generation source 11. A circular polarization converter 20 may also be provided.

When the high-frequency generation source 11, the oscillation frequency of which is fixed, is used in this manner, accurate impedance matching can be performed by the automatic matching device. Then, the high-frequency electromagnetic field can be efficiently supplied into the plasma chamber 101A, so that the energy efficiency of the plasma processor can be improved.

Since the high-frequency generation source 11 need no expensive high-output oscillator, as described above, the manufacturing cost of the plasma processor having a high energy efficiency can be suppressed.

In place of the high-frequency generation source 11, the high-frequency generation source 11A, 11B, or 11C shown in FIG. 5, 8, or 9 can be used.

(Sixth Embodiment)

Figure 11:
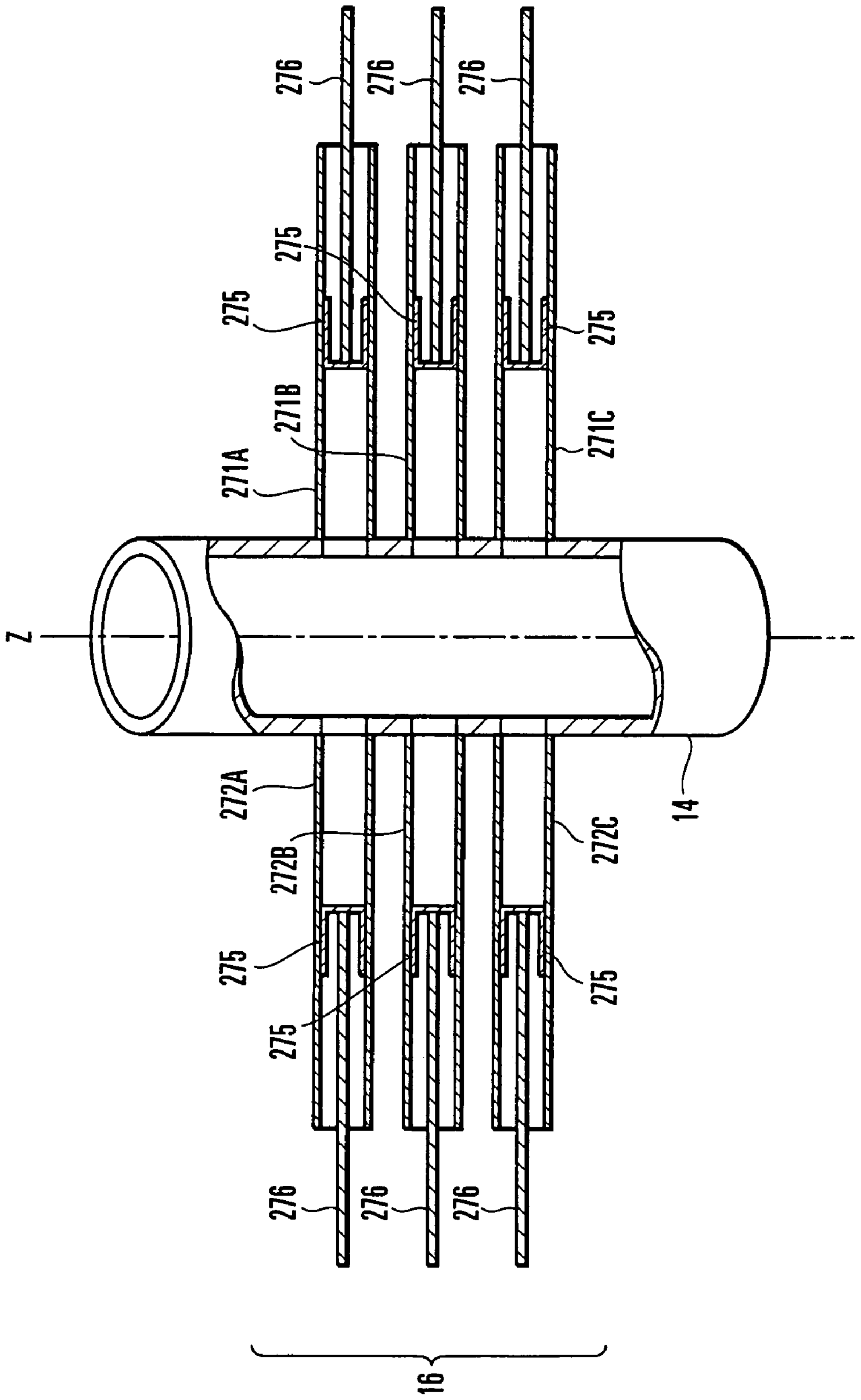
FIG. 11 is a view showing another arrangement of the load matching unit.

The load matching unit 16 that can be used by the plasma processor of the present invention is not limited to one including the plurality of stubs 71A to 71C and 72A to 72C shown in FIG. 2. FIG. 11 is a view showing another arrangement of the load matching unit 16.

The load matching unit 16 shown in FIG. 11 includes a plurality of branched waveguides connected perpendicularly to the direction of the axis (Z) of a cylindrical waveguide 14. More specifically, the load matching unit 16 includes three branched waveguides 271A to 271C disposed equidistantly in the direction of the axis (Z) of the cylindrical waveguide 14, and three branched waveguides 272A to 272C disposed to oppose the three branched waveguides 271A to 271C, respectively.

As each of the branched waveguides 271A to 271C and 272A to 272C, a rectangular waveguide whose section perpendicular to the axis of the waveguide is rectangular, a cylindrical waveguide having a circular section, a waveguide having an elliptic section, a waveguide having a round-cornered rectangular section, or a ridge waveguide having a ridge at its central portion can be used.

Figure 12A:
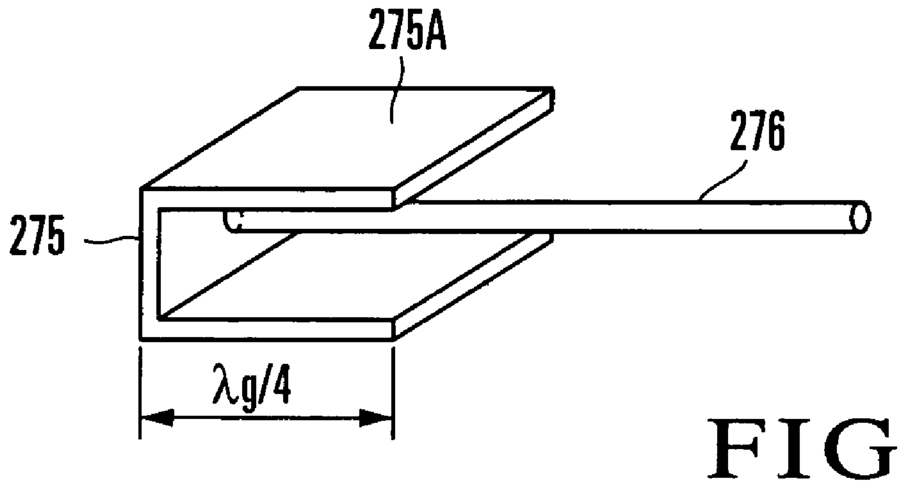
FIG. 12A is a perspective view showing an arrangement of the short-circuiting plate of a branched waveguide.
Figure 12B:
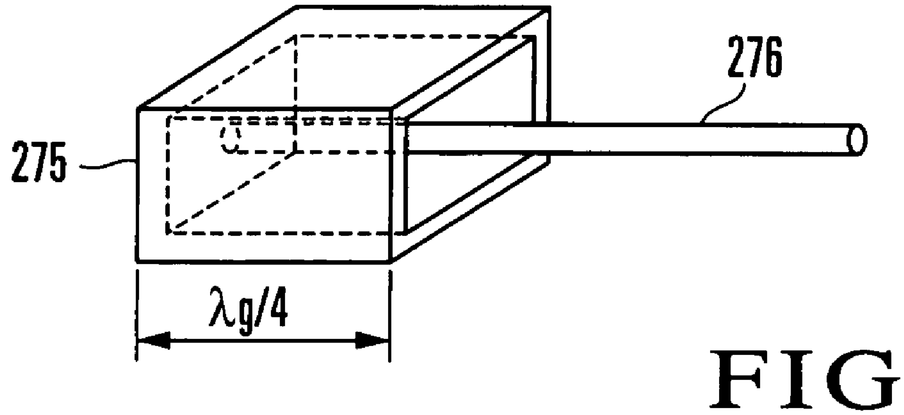
FIG. 12B is a perspective view showing another arrangement of the short-circuiting plate of the branched waveguide.
Figure 13:
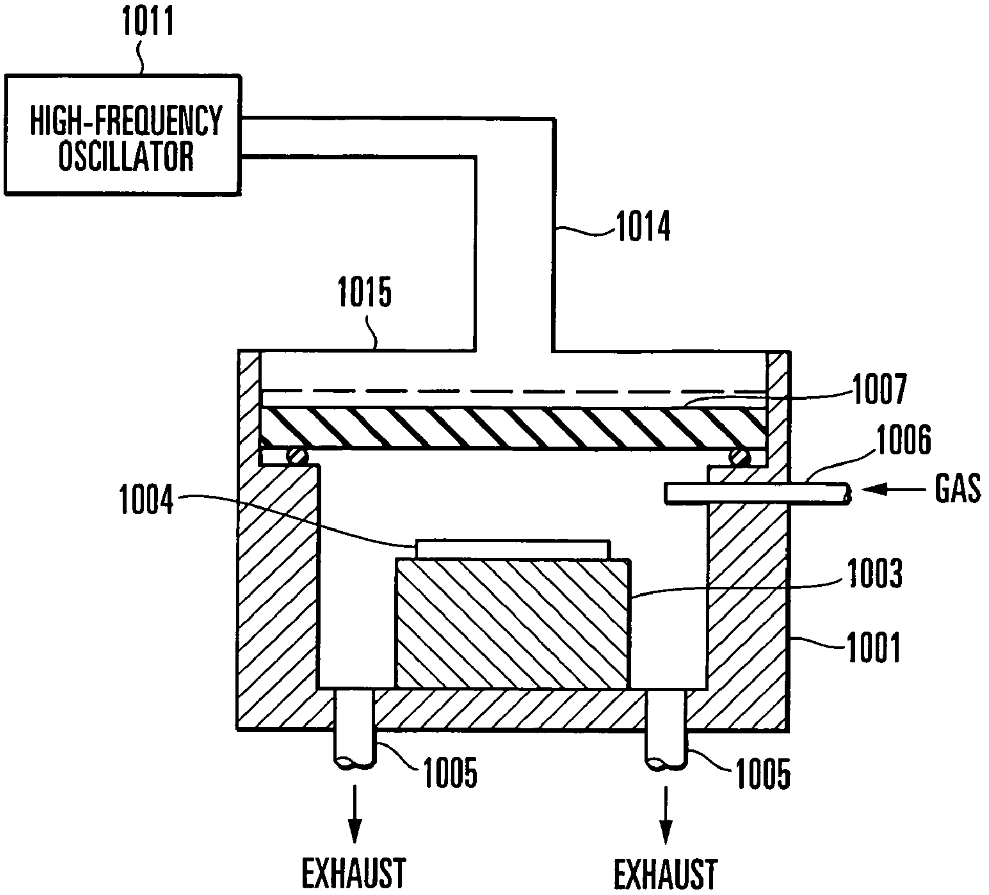
FIG. 13 is a view showing the overall structure of a conventional high-frequency plasma processor.

Each of the branched waveguides 271A to 271C and 272A to 272C has one end that opens in the cylindrical waveguide 14 and the other end that is electro-functionally short-circuited by a corresponding short-circuiting plate 275. As shown in FIG. 12B, each short-circuiting plate 275 has a U-shaped side surface with its upper and lower ends being bent at a right angle. That portion 275A which is bent (to be referred to as a bent portion hereinafter) is inserted in the corresponding one of the branched waveguides 271A to 274C to be directed to the opposite side of the open end of the cylindrical waveguide 14. When the bent portion 275A of each short-circuiting plate 275 has a length of about λg/4 and an insulating sheet is adhered to it to form a so-called choke structure, the bent portion 275A can have mobility while ensuring reflection of the high-frequency electromagnetic field at the position of the short-circuiting plate 275. Alternatively, the upper, lower, left, and right end portions of the short-circuiting plate 275 may be bent at a right angle, as shown in FIG. 12B.

The short-circuiting plates 275 are attached to the distal ends of rods 276 extending in the axial directions of the branched waveguides 271A to 271C and 272A to 272C. When the rods 276 are translated in the axial directions of the branched waveguides 271A to 271C and 272A to 272C by the driver for the load matching unit 16, the short-circuiting plates 275 can be freely slid in the branched waveguides 271A to 271C and 272A to 272C.

The reactance of each of the branched waveguides 271A to 271C and 272A to 272C changes in accordance with an electrical length obtained by dividing the length from one end to the other end of the branched waveguide by a tube wavelength λg. Accordingly, when the electrical lengths are changed by sliding the short-circuiting plates 275 each forming the other end of the corresponding one of the branched waveguides 271A to 271C and 272A to 272C, the reactances of the branched waveguides 271A to 271C and 272A to 272C can be changed in a wide range of a sufficiently small − (minus) value to a sufficiently large + (plus) value through 0 (zero).

The pitch of the branched waveguides 271A to 271C and 272A to 272C in the direction of the axis (Z) of the cylindrical waveguide 14 is set to λg/4. When the reactances of the branched waveguides 271A to 271C and 272A to 272C are changed in the wide range of 0 (zero) to a sufficiently large/small +/− value, the load matching unit 16 can have a matching range that covers the entire Smith chart. Even when the pitch of the branched waveguides 271A to 271C and the like is set to λg/8, a wide matching range that covers the entire Smith chart can be similarly obtained. Even when reflection from the plasma as a load is large, full-phase impedance matching can be performed.

The branched waveguides 271A to 271C and 272A to 272C do not have arrangements, like the stubs 71A to 71C and 72A to 72C, that project into the cylindrical waveguide 14. Even if reflection from the plasma as a load is large, electric discharge does not occur between the branched waveguides 271A to 271C and the branched waveguides 272A to 272C that oppose each other.

Even when only the branched waveguides 271A to 271C are used, a matching range that covers the entire Smith range can be obtained, and full-phase impedance matching can be performed.

When three or more branched waveguides are disposed in the direction of the axis (Z) of the cylindrical waveguide 14, if their pitch is set to λg/4 or λg/8, full-phase impedance matching can be performed.

Even when the distances among the branched waveguides disposed in the direction of the axis (Z) are not equal, full-phase impedance matching can be performed. For example, the distance between the branched waveguides 271A and 271B may be set to λg/4, and the distance between the branched waveguides 271B and 271C may be set to λg/8.

If two branched waveguides are disposed in the direction of the axis (Z), or if the pitch of the branched waveguides disposed in the direction of the axis (Z) of the cylindrical waveguide 14 is a value other than λg×N/2, λg/4, and λg/8, the matching range becomes narrow, but depending on the conditions, the resultant cylindrical waveguide 14 can be used.

Although the load matching unit 16 and detector 18 of the automatic matching device are provided to the cylindrical waveguide 14 in the above description, they can be provided to the rectangular waveguide 12.

The plasma processor according to the present invention can be used in an etching apparatus, CVD apparatus, ashing apparatus, and the like.

In the embodiments described above, the reference oscillator which is lower in output power than the high-frequency oscillator that generates the high-frequency electromagnetic field used for plasma generation and stable in oscillation frequency is prepared. The reference signal generated by the reference oscillator is injected into the high-frequency oscillator to fix the oscillation frequency of the high-frequency oscillator at the frequency of the reference signal. The frequency band of the high-frequency oscillator becomes narrow and its oscillation frequency is stabilized. Therefore, the frequency component which is different from the frequency of the reference signal is decreased. When the automatic matching device which is provided to the waveguide that guides the high-frequency electromagnetic field generated by the high-frequency oscillator to the vessel where the plasma is to be generated is designed on the basis of the frequency of the reference signal, accurate impedance matching can be performed to improve the energy efficiency.

An oscillator having good frequency stability is inexpensive if its output power is low. When such an inexpensive oscillator is used as the reference oscillator, the manufacturing cost of the plasma processor having a high energy efficiency can be suppressed.

In the embodiments described above, the high-frequency electromagnetic field generated by the high-frequency oscillator is attenuated by the attenuator and supplied into the vessel where the plasma is to be generated. Thus, the power to be supplied into the vessel can be changed. Since the output power of the high-frequency oscillator need not be changed, the center frequency does not change in response to a change in output power, so that oscillation frequency fixing can be maintained.

In the embodiments described above, the high-frequency electromagnetic fields generated by the plurality of high-frequency oscillators, to which the reference signal is to be injected, are synthesized, and the synthesized electromagnetic field is supplied to the vessel where the plasma is to be generated. Alternatively, the plurality of high-frequency oscillators are cascade-connected in the output power increasing order. The reference signal is injected into the first-stage high-frequency oscillator. The high-frequency electromagnetic field generated by the previous-stage high-frequency oscillator is injected into each one of the remaining high-frequency oscillators. The high-frequency electromagnetic field generated by the last-stage high-frequency oscillator is supplied to the vessel where the plasma is to be generated. With this structure, no expensive high-output oscillator need be used to realize a high-output, frequency-stable high-frequency generation source. As a result, the manufacturing cost of the plasma processor can be suppressed.

The invention claimed is:

1. A plasma processor characterized by comprising:
- a table on which a target object is to be placed;
- a vessel which accommodates said table and in which a plasma is to be generated by a high-frequency electromagnetic field supplied thereto;
- a high-frequency oscillator which generates the high-frequency electromagnetic field; and
- a reference oscillator which is lower in output power than said high-frequency oscillator and stable in oscillation frequency,
- wherein a reference signal generated by said reference oscillator is injected into said high-frequency oscillator to fix an oscillation frequency of said high-frequency oscillator at a frequency of the reference signal.

2. A plasma processor according to claim 1, characterized by comprising a waveguide which guides the high-frequency electromagnetic field generated by said high-frequency oscillator to said vessel.

3. A plasma processor according to claim 2, characterized in that said high-frequency oscillator has a first antenna which outputs the high-frequency electromagnetic field to said waveguide.

4. A plasma processor according to claim 3, characterized in that said reference oscillator outputs the reference signal to said waveguide and the reference signal is injected into said high-frequency oscillator through said first antenna.

5. A plasma processor according to claim 4, characterized by comprising an element which is provided at a connecting portion of said reference oscillator and waveguide, sends the high-frequency electromagnetic field from a side of said high-frequency oscillator to a side of said vessel, and sends the reference signal from a side of said reference oscillator to the side of said high-frequency oscillator.

6. A plasma processor according to claim 1, characterized in that said high-frequency oscillator comprises a magnetron.

7. A plasma processor according to claim 1, characterized in that said reference oscillator comprises a dielectric oscillator.

8. A plasma processor according to claim 2, characterized by comprising an attenuator which is connected to said waveguide and attenuates the high-frequency electromagnetic field.

9. A plasma processor according to claim 2, characterized in that said high-frequency oscillator comprises a plurality of high-frequency oscillators to which the reference signal is to be injected, and the plasma processor further comprises a synthesizer which synthesizes the high-frequency electromagnetic fields generated by said high-frequency oscillators and outputs a synthesized electromagnetic field to said waveguide.

10. A plasma processor according to claim 2, characterized in that said plurality of high-frequency oscillator comprises a plurality of high-frequency oscillators, wherein said plurality of high-frequency oscillators are cascade-connected in an output power increasing order, the reference signal is injected into a first-stage high-frequency oscillator, a high-frequency electromagnetic field generated by a previous-stage high-frequency oscillator is injected into each one of remaining high-frequency oscillators, and a high-frequency electromagnetic field generated by a last-stage high-frequency oscillator is output to said waveguide.

11. A plasma processor according to claim 2, characterized by comprising an element which is provided to said waveguide, sends the high-frequency electromagnetic field from a side of said high-frequency oscillator to a side of said vessel, and sends a high-frequency electromagnetic field from the side of said vessel to a dummy load.

12. A plasma processor according to claim 2, characterized by comprising a load matching unit which is provided to said waveguide and performs impedance matching between a side of said high-frequency oscillator and a side of said vessel.

13. A plasma processor according to claim 11, characterized in that said load matching unit comprises a plurality of branched waveguides each of which is connected perpendicularly to an axial direction of said waveguide, has one end that opens in said waveguide, and the other end that is electro-functionally short-circuited, wherein said branched waveguides is disposed in the axial direction of said waveguide at a predetermined pitch based on the frequency of the reference signal.

14. A plasma processor according to claim 2, characterized by comprising a second antenna which is arranged to oppose said table, is connected to said waveguide, and supplies the high-frequency electromagnetic field guided by said waveguide into said vessel.

15. A plasma processor according to claim 1, characterized by comprising a magnetic field generator which generates a magnetic field in said vessel, wherein a plasma is generated by using electrons heated by electron cyclotron resonance.

16. A plasma processing method characterized by comprising the steps of:

generating a reference signal by a reference oscillator which is lower in output power than a high-frequency oscillator that generates a high-frequency electromagnetic field and stable in oscillation frequency;

injecting the reference signal into the high-frequency oscillator to fix an oscillation frequency of the high-frequency oscillator at a frequency of the reference signal;

supplying the high-frequency electromagnetic field generated by the high-frequency oscillator into a vessel to generate a plasma; and processing a target object arranged in the vessel by using the plasma.

17. A plasma processing method according to claim 16, characterized in that the high-frequency electromagnetic field is attenuated by an attenuator before being supplied into the vessel.

* * * * *